(12) United States Patent
Takahashi

(10) Patent No.: US 11,145,912 B2
(45) Date of Patent: Oct. 12, 2021

(54) SECONDARY BATTERY SYSTEM AND METHOD OF ESTIMATING STRESS OF ACTIVE MATERIAL OF SECONDARY BATTERY

(71) Applicant: TOYOTA JIDOSHA KABUSHIKI KAISHA, Toyota (JP)

(72) Inventor: Kenji Takahashi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 266 days.

(21) Appl. No.: 16/193,463

(22) Filed: Nov. 16, 2018

(65) Prior Publication Data

US 2019/0181510 A1 Jun. 13, 2019

(30) Foreign Application Priority Data

Dec. 12, 2017 (JP) ............................. JP2017-237883

(51) Int. Cl.
  *H01M 10/48* (2006.01)
  *G01R 31/367* (2019.01)
  (Continued)

(52) U.S. Cl.
  CPC .......... *H01M 10/48* (2013.01); *G01R 31/367* (2019.01); *H01M 4/386* (2013.01);
  (Continued)

(58) Field of Classification Search
  None
  See application file for complete search history.

(56) References Cited

U.S. PATENT DOCUMENTS

2015/0253389 A1  9/2015  Arai et al.
2017/0092996 A1* 3/2017  Rodriguez ............ H01M 10/48
(Continued)

FOREIGN PATENT DOCUMENTS

JP    2011-097729 A    5/2011
JP    2013-158087 A    8/2013
(Continued)

OTHER PUBLICATIONS

Dai et al. "State of charge estimation for lithium-ion pouch batteries based on stress measurement." Energy 129 (Apr. 19, 2017) p. 16-27. (Year: 2017).*

(Continued)

*Primary Examiner* — Christopher P Domone
(74) *Attorney, Agent, or Firm* — Sughrue Mion, PLLC

(57) ABSTRACT

A secondary battery system includes an electronic control unit (ECU) that estimates surface stress generated in a negative-electrode active material upon incorporation or removal of lithium in a negative electrode of a battery assembly. The ECU calculates an estimated value of the surface stress from a difference obtained by subtracting a reference lithium amount from an amount of lithium contained in the negative-electrode active material, using a linear relationship between the difference and the surface stress. The ECU sets the surface stress to yield stress when the magnitude of the estimated value is larger than that of the yield stress (compressive stress or tensile stress) of the active material, and employs the estimated value as the surface stress when the magnitude of the estimated value is smaller than that of the yield stress.

9 Claims, 11 Drawing Sheets

(51) Int. Cl.
  *H01M 4/38*   (2006.01)
  *H01M 10/052*  (2010.01)
  *H01M 4/02*   (2006.01)
  *G01R 31/374*  (2019.01)
  *G01R 31/3835* (2019.01)

(52) U.S. Cl.
  CPC ....... *H01M 10/052* (2013.01); *H01M 10/482* (2013.01); *H01M 10/486* (2013.01); *G01R 31/374* (2019.01); *G01R 31/3835* (2019.01); *H01M 2004/027* (2013.01); *H01M 2004/028* (2013.01)

(56) References Cited

U.S. PATENT DOCUMENTS

2019/0178948 A1   6/2019   Takahashi
2019/0178952 A1   6/2019   Takahashi

FOREIGN PATENT DOCUMENTS

| JP | 2014-139521 A | 7/2014 |
| JP | 2015-166710 A | 9/2015 |
| JP | 2015225846 A | 12/2015 |
| JP | 2017-020855 A | 1/2017 |
| KR | 10-2017-0049549 A | 5/2017 |
| WO | 2016033479 A1 | 3/2016 |

OTHER PUBLICATIONS

U.S. Appl. No. 16/214,530, Kenji Takahashi, filed Dec. 10, 2018.
V. A. Sethuraman et al.: "In Situ Measurements of Stress-Potential Coupling in Lithiated Silicon", Journal of the Electrochemical Society, 157 (11) A1253-A1261 (2010).
U.S. Appl. No. 16/157,320, Kenji Takahashi, filed Oct. 11, 2018.

* cited by examiner

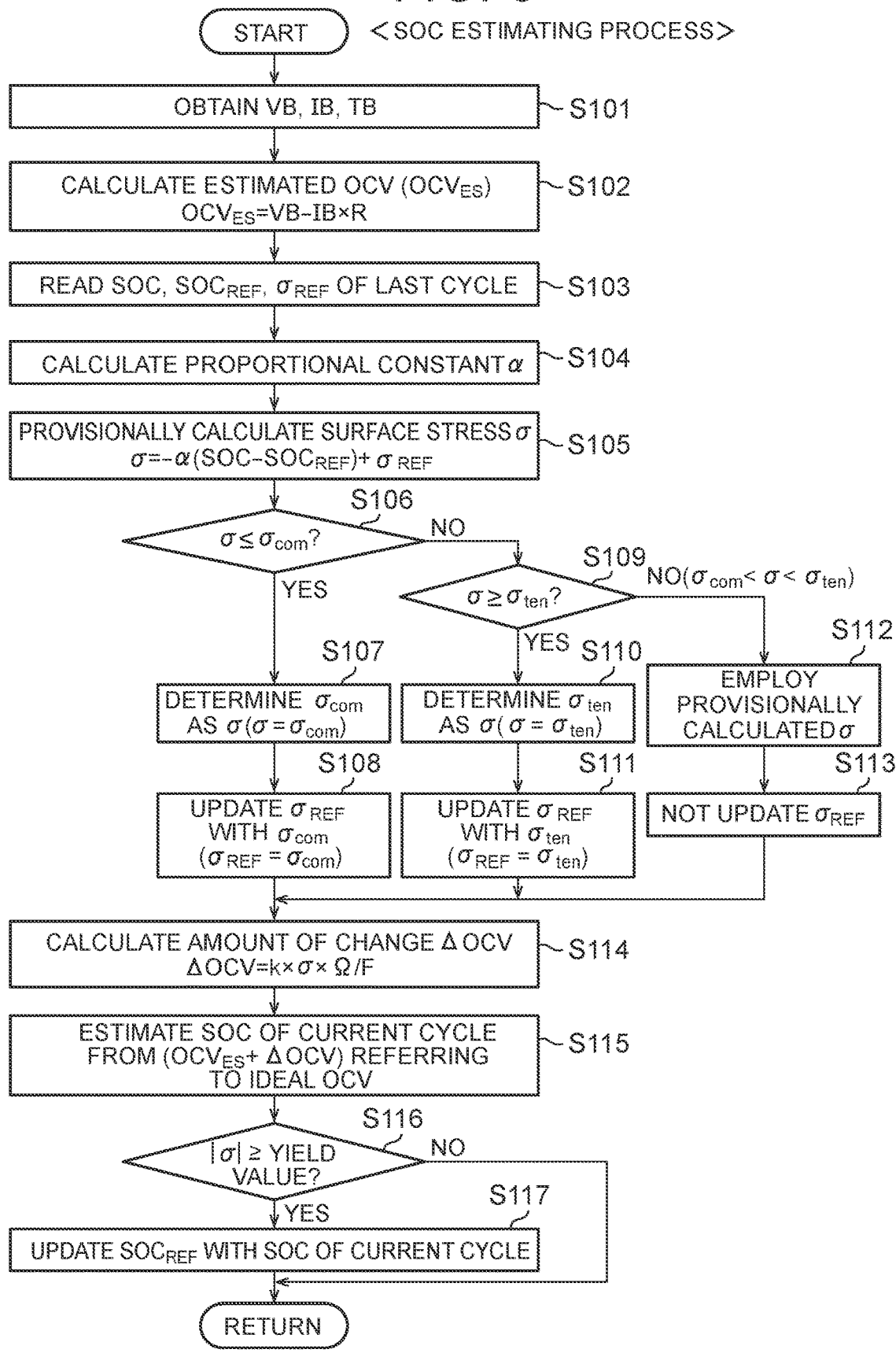

FIG. 9

| PARAMETER | DESCRIPTION |
| --- | --- |
| $SOC_{REF}$ | REFERENCE SOC<br>(SOC UPON SWITCHING OF CHARGE/DISCHARGE) |
| $\sigma$ | SURFACE STRESS |
| $\sigma_{REF}$ | REFERENCE STRESS (SURFACE STRESS AT $SOC_{REF}$) |
| $\sigma_{com}$ | YIELD STRESS IN COMPRESSION DIRECTION |
| $\sigma_{ten}$ | YIELD STRESS IN TENSILE DIRECTION |
| $\alpha$ | PROPORTIONAL CONSTANT<br>(SLOPE OF LINEAR RELATIONSHIP BETWEEN STRESS AND SOC DIFFERENCE) |
| $\Omega$ | AMOUNT OF CHANGE IN VOLUME OF<br>NEGATIVE ELECTRODE PER MOL OF LITHIUM |
| F | FARADAY CONSTANT |

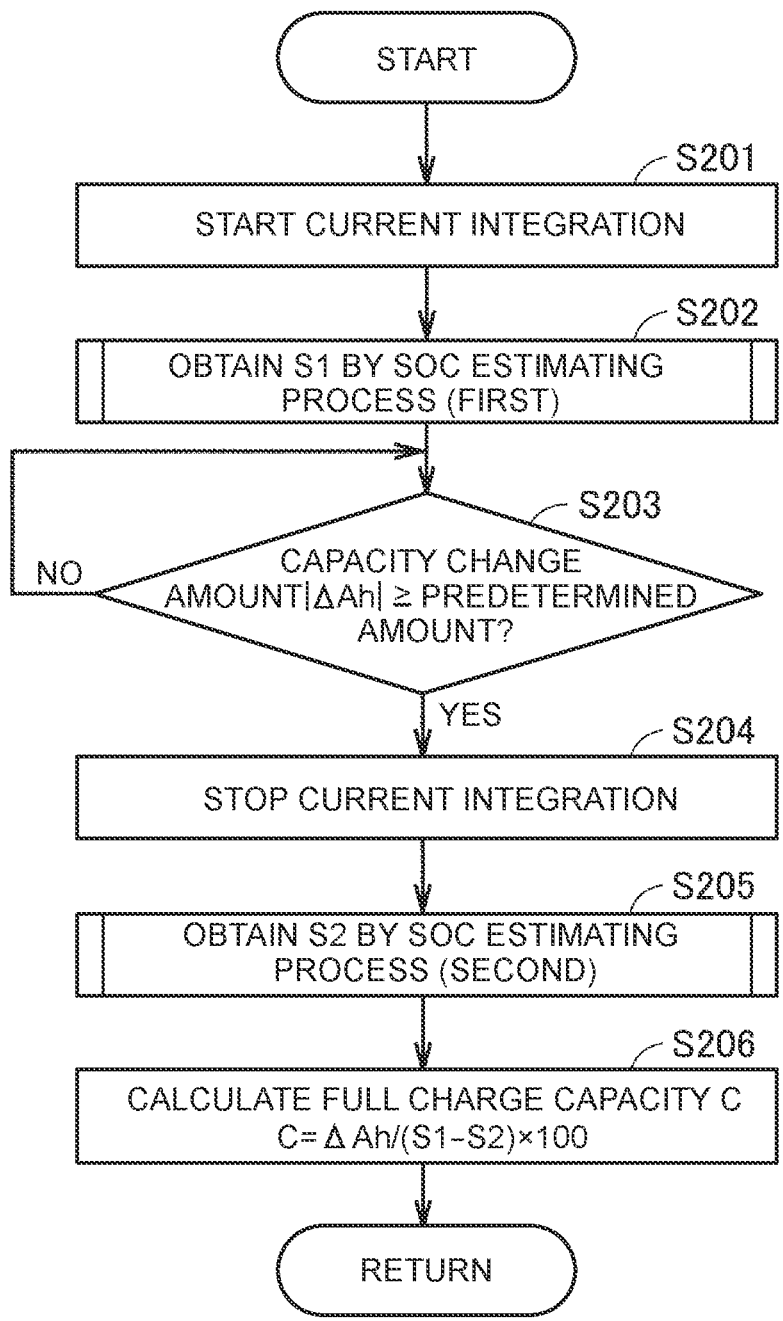

SECONDARY BATTERY SYSTEM AND METHOD OF ESTIMATING STRESS OF ACTIVE MATERIAL OF SECONDARY BATTERY

INCORPORATION BY REFERENCE

The disclosure of Japanese Patent Application No. 2017-237883 filed on Dec. 12, 2017 including the specification, drawings and abstract is incorporated herein by reference in its entirety.

BACKGROUND

1. Technical Field

The disclosure relates to a secondary battery system, and a method of estimating stress of an active material of a secondary battery, and more particularly to a technology for estimating stress that is generated in the active material of the secondary battery, as a charge carrier is incorporated into the active material, or the charge carrier is removed from the active material.

2. Description of Related Art

It is important to estimate the state of charge (SOC) of a secondary battery, so as to appropriately protect the secondary battery, and fully utilize the secondary battery. As a typical method of estimating the SOC of the secondary battery, a method of estimating the SOC from an open circuit voltage (OCV), using an SOC–OCV curve of the secondary battery, is widely known.

In some types of secondary batteries, a discharge curve as an SOC–OCV curve obtained when the secondary battery is discharged from the fully charged state, and a charge curve as an SOC–OCV curve obtained when the secondary battery is charged from the completely discharged state, significantly deviate from each other. The deviation between the charge curve and the discharge curve may also be mentioned by stating that "hysteresis" is observed in the SOC–OCV curve. For example, a technology of estimating the SOC from the OCV in view of the hysteresis is disclosed in Japanese Unexamined Patent Application Publication No. 2015-166710 (JP 2015-166710 A).

SUMMARY

One reason why the hysteresis as described above appears in the SOC–OCV curve is that hysteresis is observed in stress generated in a surface and an interior of an active material as a charge carrier is incorporated into or removed from the active material, as will be described in detail later. If the stress can be estimated in view of the hysteresis, the state (e.g., the SOC) of the secondary battery can also be estimated with high accuracy.

This disclosure is to improve the accuracy in estimation of stress generated in an active material of a secondary battery.

A secondary battery system according to a first aspect of the disclosure includes a secondary battery having an electrode containing an active material into and from which a charge carrier is reversibly incorporated and removed, and a control unit configured to estimate a stress generated in the active material as the charge carrier is incorporated into or removed from the active material. The control unit calculates an estimated value of the stress from a difference obtained by subtracting a reference charge carrier amount from an amount of the charge carrier contained in the active material, using a first linear relationship between the difference and the stress. The control unit corrects the estimated value to a yield stress of the active material when a magnitude of the estimated value is larger than a magnitude of the yield stress of the active material.

The amount of the charge carrier contained in the active material may be represented by an SOC of the secondary battery, and the reference charge carrier amount may be represented by a reference SOC as the SOC obtained at a time when the secondary battery is switched between charge and discharge in a condition where the stress is the yield stress.

The first linear relationship may be expressed by an equation (1) below. In the equation (1), σ denotes the stress, $SOC_{REF}$ denotes the reference SOC, $\sigma_{REF}$ denotes a stress in the case where the SOC of the secondary battery is the reference SOC, and a denotes a positive proportional constant indicating the first linear relationship.

$$\sigma = -\alpha(SOC - SOC_{REF}) + \sigma_{REF} \qquad (1),$$

With the above configurations, the stress is calculated, using the first linear relationship (expressed by the above equation, for example) between the stress and the difference (obtained by subtracting the reference charge carrier amount from the amount of charge carrier, for example, SOC–reference SOC). Then, the stress is compared with the yield stress. When the stress exceeds the yield stress, it is determined that the stress is the yield stress (the active material yields), and the stress is determined as being equal to the yield stress. On the other hand, when yielding of the stress does not occur, the stress (estimated value) calculated according to the first linear relationship as indicated above is employed as it is. Thus, it is possible to estimate the stress with high accuracy, by using a model in which yielding of the stress and the first linear relationship are taken into consideration.

The control unit may be configured to calculate the proportional constant from at least one of the temperature and the SOC of the secondary battery, using a correlative relationship between at least one of the temperature and the SOC of the secondary battery, and the proportional constant.

With this configuration, the proportional constant is calculated using the correlative relationship, so that the stress can be estimated with even higher accuracy.

The control unit may be configured to calculate an amount of change of an OCV from the stress, using a second linear relationship between the amount of change of the OCV caused by the stress, relative to the OCV in the case where the stress is a reference stress, and the stress. The control unit may be configured to estimate the SOC of the secondary battery from the amount of change of the OCV, by referring to a correspondence relationship between the OCV and the SOC of the secondary battery when the stress is the reference stress.

With this configuration, the SOC is estimated in view of the stress estimated with high accuracy, and therefore, the accuracy in estimation of the SOC can be improved.

The control unit may be configured to estimate a first SOC by executing the SOC estimating process, and estimate a second SOC by executing the SOC estimating process again when the amount of change in the capacity of the secondary battery from the time of estimation of the first SOC exceeds a predetermined amount. The control unit may calculate a full charge capacity of the secondary battery, based on an SOC difference between the first SOC and the second SOC, and the amount of change in the capacity of the secondary battery between the time of estimation of the first SOC, and the time of estimation of the second SOC.

With the above configuration, the accuracy in estimation of the SOC is improved, so that the full charge capacity of the secondary battery can also be calculated with high accuracy, based on the SOC estimated with high accuracy.

The active material may include a first active material and a second active material. The amount of change in the volume of the second active material during charge or discharge of the secondary battery may be larger than the amount of change in the volume of the first active material during charge or discharge of the secondary battery. The relationship between the OCV and the SOC of the secondary battery may include a first SOC region, and a second SOC region having larger hysteresis of the OCV of the secondary battery during charge or discharge of the secondary battery, than the hysteresis in the first SOC region. The control unit may be configured to repeatedly estimate the SOC of the secondary battery, and execute the SOC estimating process when the SOC of the secondary battery estimated in the last cycle is within the second SOC region. The control unit may be configured to estimate the SOC of the secondary battery according to a relationship between the OCV and the SOC of the secondary battery other than the above correspondence relationship, when the estimated SOC of the secondary battery estimated in the last cycle is within the first SOC region.

With the above configuration, the SOC is estimated by the SOC estimating process, in the second SOC region in which significant hysteresis is observed in the OCV, and the SOC is estimated by a method (more specifically, a method using a normal SOC-OCV curve) other than the SOC estimating process, in the first SOC region in which significant hysteresis does not appear. Since the SOC estimating process may require a large calculation resource, the use of the normal method in the first SOC region makes it possible to save the calculation resource of the control unit.

A method of estimating a stress generated in an active material of a secondary battery according to a second aspect of the disclosure is a method of estimating the stress generated in the active material of the secondary battery as a charge carrier is incorporated into and is removed from the active material. The stress estimating method includes calculating an estimated value of the stress from a difference obtained by subtracting a reference charge carrier amount from an amount of the charge carrier contained in the active material, using a first linear relationship between the difference and the stress, and correcting the estimated value to a yield stress of the active material when a magnitude of the estimated value is larger than a magnitude of the yield stress of the active material.

According to this method, the stress can be estimated with high accuracy, similarly to the configuration of the first aspect.

A secondary battery system according to a third aspect of the disclosure includes a secondary battery having an electrode containing an active material into and from which a charge carrier is reversibly incorporated and removed; and a control unit configured to estimate a stress generated in the active material as the charge carrier is incorporated into or removed from the active material. The control unit is configured to calculate an estimated value of the stress from a difference obtained by subtracting a reference charge carrier amount from an amount of the charge carrier contained in the active material, using a first linear relationship between the difference and the stress, and correct the estimated value to a yield stress of the active material when the estimated value is larger than tensile stress of the active material at a time of yielding or is smaller than compressive stress of the active material at the time of yielding.

According to this disclosure, the accuracy in estimation of stress generated in the active material of the secondary battery can be improved.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 8 is a flowchart illustrating an SOC estimating process according to the first embodiment;

FIG. 9 is a view useful for explaining the contents of parameters;

FIG. 10 is a flowchart illustrating a full charge capacity calculating process according to a second embodiment;

DETAILED DESCRIPTION OF EMBODIMENTS

Figure 1:
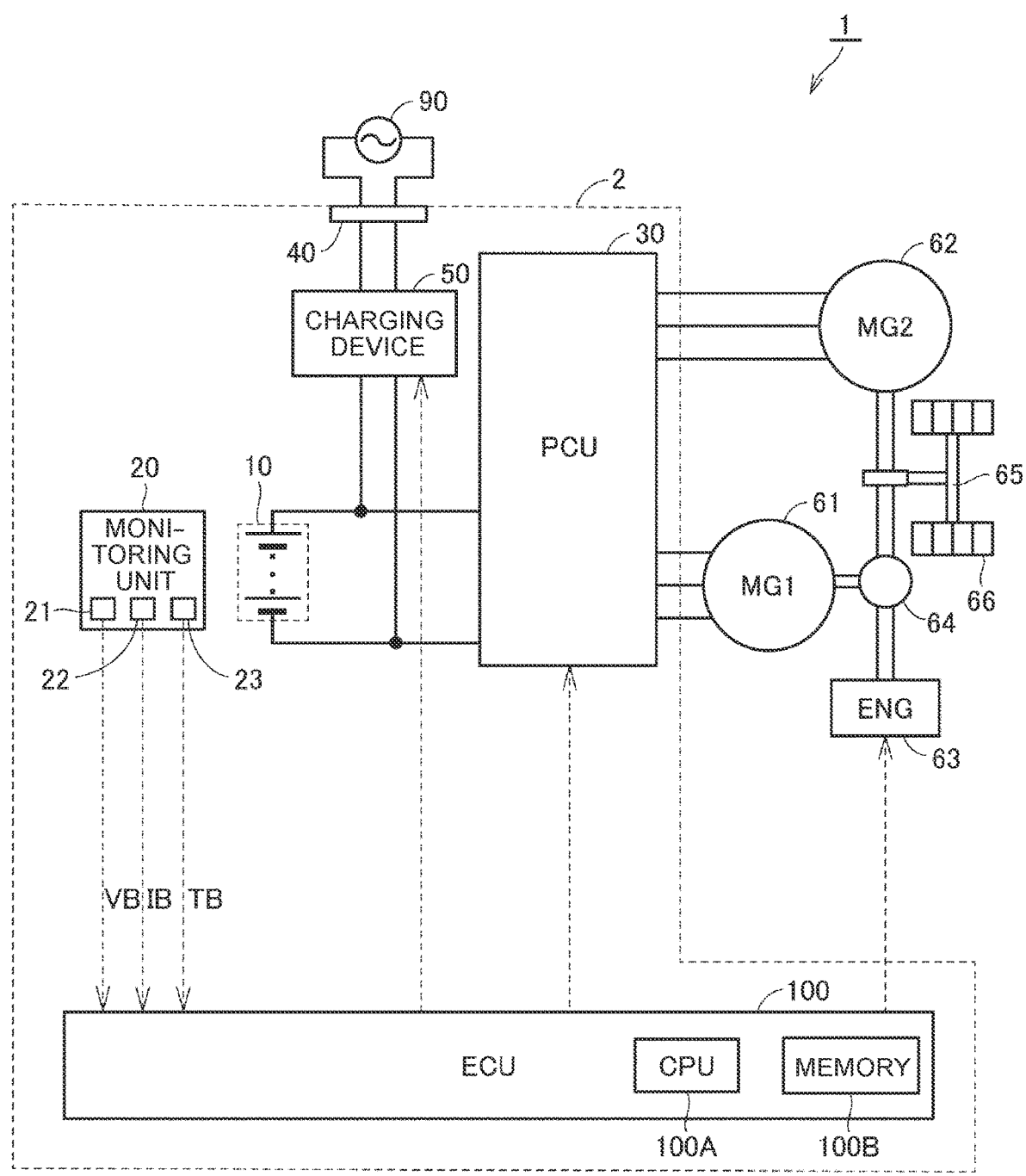
FIG. 1 is a view schematically showing the overall configuration of a vehicle installed with a secondary battery system according to a first embodiment.

Some embodiments of the disclosure will be described in detail with reference to the drawings. In the drawings, the same reference numerals are assigned to the same or corresponding portions, of which description will not be repeated.

In the following example, a secondary battery system according to each of the embodiments is installed on a hybrid vehicle (more particularly, a plug-in hybrid vehicle).

However, the secondary battery system according to each embodiment is not limitedly used in the hybrid vehicle, but may be used in vehicles in general (such as an electric vehicle, and a fuel cell vehicle) each installed with a battery assembly for propelling the vehicle. Further, the secondary battery system according to each embodiment is not limitedly used for vehicles, but may be used as a stationary system, for example.

In a first embodiment described below, the state of charge (SOC) of the secondary battery is estimated, using a method of estimating stress of an active material according to the disclosure.

FIG. 1 schematically shows the overall configuration of a vehicle on which a secondary battery system according to the first embodiment is installed. Referring to FIG. 1, the vehicle 1, which is a plug-in hybrid vehicle, includes a secondary battery system 2, motor-generators 61, 62, engine 63, power split device 64, drive axle 65, and drive wheels 66. The secondary battery system 2 includes a battery assembly 10, monitoring unit 20, power control unit (PCU) 30, inlet 40, charging device 50, and an electronic control unit (ECU) 100.

Each of the motor-generators 61, 62 is an alternating-current rotating electric machine, for example, a three-phase alternating-current synchronous motor in which permanent magnets are embedded in a rotor. The motor-generator 61 is mainly used as a generator that is driven by the engine 63 via the power split device 64. Electric power generated by the motor-generator 61 is supplied to the motor-generator 62 or the battery assembly 10 via the PCU 30.

The motor-generator 62 mainly operates as an electric motor, and drives the drive wheels 66. The motor-generator 62 is driven with at least one of electric power from the battery assembly 10 and electric power generated by the motor-generator 61, and drive power of the motor-generator 62 is transmitted to the drive axle 65. On the other hand, when a brake is applied to the vehicle, or the acceleration on a downhill slope is reduced, the motor-generator 62 operates as a generator, to perform regenerative power generation. Electric power generated by the motor-generator 62 is supplied to the battery assembly 10 via the PCU 30.

The engine 63 is an internal combustion engine that delivers power, by converting combustion energy produced when an air-fuel mixture is burned, into kinetic energy of a moving body, such as a piston or a rotor.

The power split device 64 includes a planetary gear mechanism (not shown) having three rotary shafts of a sun gear, carrier, and ring gear. The power split device 64 splits power delivered from the engine 63, into power for driving the motor-generator 61, and power for driving the drive wheels 66.

Figure 2:
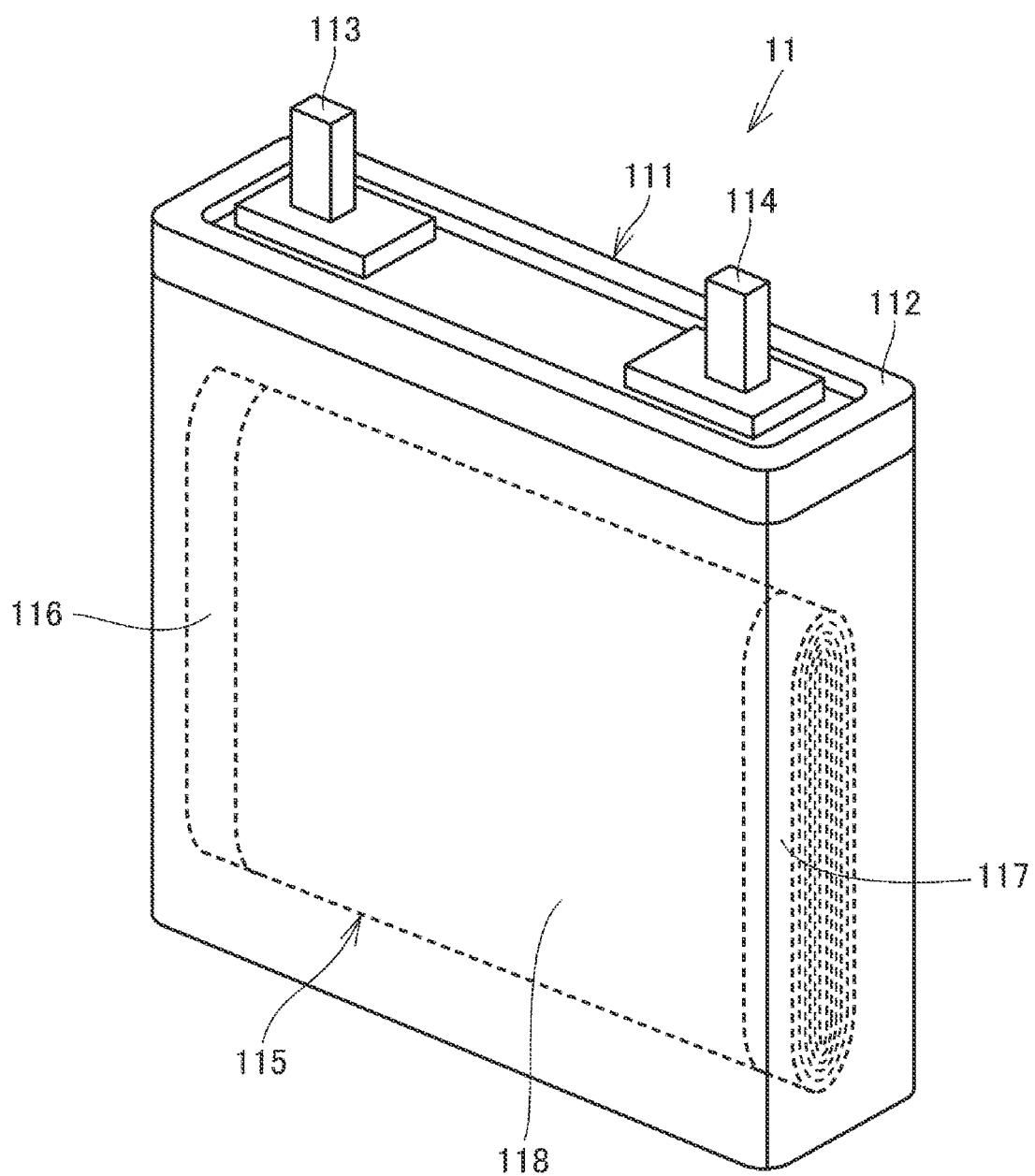
FIG. 2 is a view useful for describing the configuration of each cell in more detail.

The battery assembly 10 includes a plurality of cells 11 (see FIG. 2). In this embodiment, each cell is a lithium-ion secondary battery. The electrolyte of the lithium-ion secondary battery is not limited to that of a liquid type, but may be of a polymer type, or an all solid type.

The battery assembly 10 stores electric power for driving the motor-generators 61, 62, and supplies electric power to the motor-generators 61, 62 via the PCU 30. The battery assembly 10 is also charged with electric power generated by the motor-generators 61, 62 via the PCU 30.

The monitoring unit 20 includes a voltage sensor 21, current sensor 22, and a temperature sensor 23. The voltage sensor 21 detects a voltage of each cell 11 included in the battery assembly 10. The current sensor 22 detects a current IB that flows into and out of the battery assembly 10. The current IB during charge takes a positive value, and the current IB during discharge takes a negative value. The temperature sensor 23 detects a temperature of each cell 11. Each of the sensors outputs its detection result to the ECU 100.

The voltage sensor 21 may detect a voltage VB across two or more cells 11 connected in series, as a monitoring unit, for example. Also, the temperature sensor 23 may detect a temperature TB of two or more adjacent cells 11 as a monitoring unit. Thus, in this embodiment, the monitoring unit is not particularly limited. Thus, for the sake of simplicity in description, it is simply stated that "the voltage VB of the battery assembly 10 is detected", or "the temperature TB of the battery assembly 10 is detected". Similarly, the battery assembly 10 is referred to as an estimation unit, when the SOC and the open-circuit voltage (OCV) are estimated.

The PCU 30 performs bi-directional electric power conversion between the battery assembly 10 and the motor-generators 61, 62, according to control signals from the ECU 100. The PCU 30 is able to individually control the respective states of the motor-generators 61, 62. For example, the PCU 30 can place the motor-generator 62 in a power running state, while placing the motor-generator 61 in a regenerative state (power generating state). For example, the PCU 30 includes two inverters (not shown) corresponding to the motor-generators 61, 62, and converters (not shown) that raise the direct-current voltage supplied to each inverter to a level equal to or higher than the output voltage of the battery assembly 10.

A charging cable can be connected to the inlet 40. The inlet 40 is supplied with electric power from a power supply 90 provided outside the vehicle 1, via the charging cable. The power supply 90 is, for example, a commercial power supply.

The charging device 50 converts electric power supplied from the power supply 90 via the charging cable and the inlet 40, into electric power suitable for charging the battery assembly 10, according to a control signal from the ECU 100. The charging device 50 includes an inverter and a converter (both of which are not illustrated in the drawings).

The ECU 100 includes a central processing unit (CPU) 100A, memory (more specifically, a read-only memory (ROM) and a random access memory (RAM)) 100B, and an input/output port (not shown) for inputting and outputting various signals. The ECU 100 executes an "SOC estimating process" of estimating the SOC of the battery assembly 10, based on a signal received from each sensor of the monitoring unit 20, and a program and a map stored in the memory 100B. Then, the ECU 100 controls charge/discharge of the battery assembly 10, according to the result of the SOC estimating process. The SOC estimating process will be described in detail later. The ECU 100 corresponds to "control unit" according to the disclosure.

Referring to FIG. 2, the configuration of each cell 11 will be described in detail. In FIG. 2, the cell 11 is illustrated with its interior seen through.

As shown in FIG. 2, the cell 11 has a generally rectangular battery case 111. The top side of the battery case 111 is sealed with a lid body 112. One end of each of a positive terminal 113 and a negative terminal 114 protrudes outward from the lid body 112. The other ends of the positive terminal 113 and negative terminal 114 are respectively connected to an interior positive terminal and an interior negative terminal (both of which are not shown), within the battery case 111. An electrode body 115 is housed in the battery case 111. The electrode body 115 is formed by laminating a positive electrode 116 and a negative electrode 117, with a separator 118 interposed therebetween, and winding the resulting laminated structure. The electrolyte solution is held by the positive electrode 116, negative electrode 117, separator 118, etc.

As the positive electrode 116, separator 118, and electrolyte solution, known structures and materials of positive electrode, separator, and electrolyte solution of a lithium-ion secondary battery may be used. In one example, a ternary material obtained by replacing a part of lithium cobalt oxide with nickel and manganese may be used for the positive electrode 116. For the separator, polyolefin (e.g., polyethylene or polypropylene) may be used. The electrolyte solution includes an organic solvent (e.g., a mixed solvent of dimethyl carbonate (DMC), ethylmethyl carbonate (EMC), and ethylene carbonate (EC)), lithium salt (e.g., $LiPF_6$), additive (e.g., lithium bis(oxalate)borate (LiBOB) or $Li[PF_2(C_2O_4)_2]$), and so forth. Instead of using the electrolyte solution, a polymer-based electrolyte may be used, or an inorganic solid electrolyte, such as an oxide-based electrolyte or a sulfide-based electrolyte, may be used.

The structure of the cell is not particularly limited, and the electrode body may have a laminated structure, rather than the winding structure. Also, the battery case is not limited to the rectangular battery case, but may be a cylindrical or laminate-type battery case.

Next, hysteresis of electromotive voltage will be described. A typical negative-electrode active material of a lithium-ion secondary battery is a carbon material (e.g., graphite). However, in this embodiment, a silicon-based compound (Si or SiO) is employed as an active material of the negative electrode 117. The use of the silicon-based compound makes it possible to increase the energy density, etc. of the battery assembly 10. On the other hand, in a system where the silicon-based compound is employed, hysteresis may appear prominently in SOC–OCV characteristics (SOC–OCV curves). As a factor of this phenomenon, change of the volume of the negative-electrode active material during charge and discharge may be considered, as will be described later.

The negative-electrode active material expands as lithium as a charge carrier is incorporated into the active material, and contracts as lithium is removed from the active material. As the volume of the negative-electrode active material changes, stress is generated in a surface and interior of the negative-electrode active material. The amount of volume change of the silicon-based compound caused by incorporation or removal of lithium is larger than the amount of volume change of graphite. More specifically, where the minimum volume of the active material in a condition where lithium is not incorporated is taken as a reference volume, the amount of volume change (expansion rate) of graphite due to incorporation of lithium is about 1.1 times, whereas the amount of volume change (expansion rate) of the silicon-based compound is about 4 times at a maximum. Thus, when the silicon-based compound is used as the negative-electrode active material, stress generated in the surface and interior of the negative-electrode active material is increased, as compared with the case where graphite is employed. In the following description, the stress in the surface of the active material will be referred to as "surface stress $\sigma$". This is because the potential is determined according to a surface condition of the active material.

Generally, the single-electrode potential (positive-electrode potential or negative-electrode potential) is determined by conditions of the surface of the active material, more specifically, the amount of lithium in the surface of the active material, and the surface stress $\sigma$. For example, it is known that the potential of the negative electrode is reduced with increase of the amount of lithium in the surface of the negative-electrode active material. If a material, such as a silicon-based compound, which undergoes large volume changes is employed, the amount of change of the surface stress $\sigma$ with increase or reduction of the amount of lithium is also increased.

In this connection, hysteresis is observed in the surface stress $\sigma$. Thus, the negative-electrode potential can be defined with high accuracy, in view of influences of the surface stress $\sigma$ and its hysteresis. Then, when the SOC is estimated from the OCV, using the relationship between the SOC and the OCV, the negative-electrode potential defined in view of the surface stress $\sigma$ is used as a precondition, so that the SOC can be estimated with high accuracy.

Figure 3:
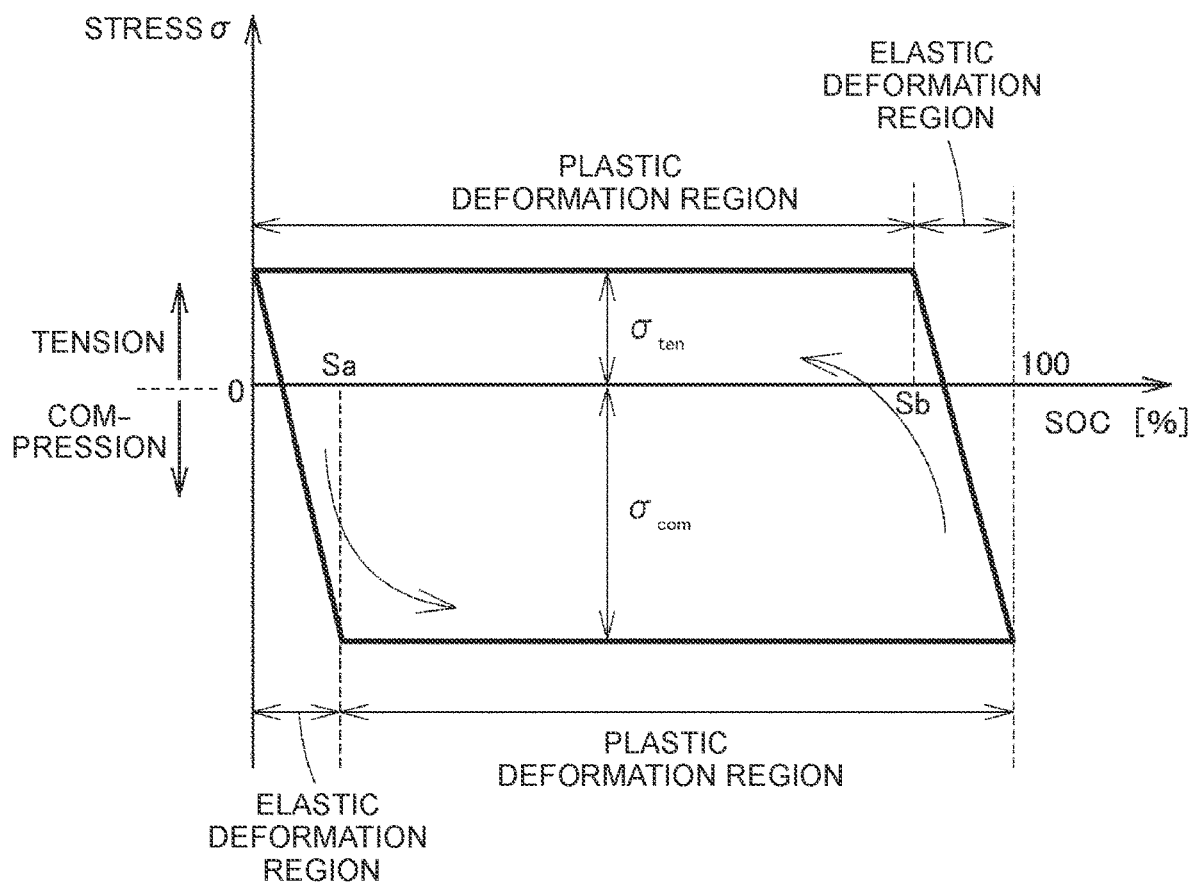
FIG. 3 is a view schematically showing one example of change of stress during charge and discharge of a unit cell.

FIG. 3 schematically shows one example of change of the surface stress $\sigma$ during charge/discharge of the unit cell (cell 11). In FIG. 3, the horizontal axis indicates the SOC of the unit cell, and the vertical axis indicates the surface stress $\sigma$. With regard to the surface stress $\sigma$ in FIG. 3, the tensile stress $\sigma_{ten}$ generated during contraction of the negative-electrode active material 71 (during discharge of the unit cell) is expressed as stress in the positive direction, and the compressive stress $\sigma_{com}$ generated during expansion of the negative-electrode active material 71 (during charge of the unit cell) is expressed as stress in the negative direction.

FIG. 3 schematically shows one example of change of the surface stress $\sigma$ when the unit cell is charged at a fixed charge rate from a fully discharged state (where SOC=0%) to a fully charged state (where SOC=100%), and then the unit cell is discharged at a fixed discharge rate from the fully charged state to the fully discharged state.

The surface stress $\sigma$ can be measured (or estimated) through thin-film evaluation. One example of a method of measuring the surface stress $\sigma$ will be briefly described. Initially, change of the curvature $\kappa$ of the negative electrode 117 in the form of a thin film deformed under the surface stress $\sigma$ is measured. For example, the curvature $\kappa$ can be optically measured by using a commercially available system for measuring the radius of curvature. Then, the surface stress $\sigma$ can be calculated by substituting the measured curvature $\kappa$, and constants (such as the Young's modulus, Poisson's ratio, and thickness) determined according to the material and shape of the negative electrode 117 (the negative-electrode active material and a peripheral member) into the Stoney equation. For details of stress measurements, see "In Situ Measurements of Stress-Potential Coupling in Lithiated Silicon", V. A. Sethuraman et al., Journal of The Electrochemical Society, 157 (11) A1253-A1261 (2010), for example.

The surface stress $\sigma$ (the absolute value thereof) increases linearly, immediately after start of charging from the fully discharged state. In this SOC region (region from SOC=0% to SOC=Sa) during charge, elastic deformation is considered to occur in the surface of the negative-electrode active material 71. However, in a region (region from SOC=Sa to SOC=100%) following the above region, the surface of the negative-electrode active material 71 is considered to go beyond elastic deformation, and reach plastic deformation. On the other hand, during discharge of the unit cell, elastic deformation is considered to occur in the surface of the negative-electrode active material 71, in a region (region from SOC=100% to SOC=Sb) immediately after start of discharging from the fully charged state, and plastic deformation is considered to occur in the surface of the negative-electrode active material 71, in a region (region from SOC=Sb to SOC=0%) following the above region. While all of the changes of the surface stress σ are indicated by straight lines in FIG. 3, these lines merely schematically indicate changes of the surface stress σ; in fact, the surface stress σ undergoes non-linear changes in plastic-deformation regions (SOC regions in which plastic deformation occurs) after yielding (see, for example, FIG. 2 of "In Situ Measurements of Stress-Potential Coupling in Lithiated Silicon", V. A. Sethuraman et al., Journal of The Electrochemical Society, 157 (11) A1253-A1261 (2010)).

When the unit cell continues to be charged, the compressive stress $\sigma_{com}$ is mainly generated in the surface of the negative-electrode active material (the surface stress σ becomes compressive stress), and the potential of the negative electrode is lowered, as compared with that in an ideal state where no compressive stress $\sigma_{com}$ is generated. As a result, the OCV of the unit cell is increased. On the other hand, when the unit cell continues to be discharged, the tensile stress $\sigma_{ten}$ is mainly generated in the surface of the negative-electrode active material (the surface stress σ becomes tensile stress), and the potential of the negative electrode is elevated, as compared with that in the ideal state. As a result, the OCV of the unit cell is reduced.

According to the above mechanism, hysteresis appears in the SOC-OCV curves of the battery assembly 10, during charge and discharge. This hysteresis is also called "electromotive voltage hysteresis". The electromotive voltage means voltage (so-called OCV) measured in a condition where the voltage of the battery assembly 10 sufficiently settles, and the lithium concentration in the active material settles. The stress that remains in the surface of the negative electrode in this settled state may be considered to be stress at the time when various forces including the stress arising in the interior of the negative-electrode active material, and counteracting force that acts on the negative-electrode active material from a peripheral material due to change of the volume of the negative-electrode active material, are balanced in a system as a whole. The peripheral material is a binder, conductive aid, or the like.

Figure 4:
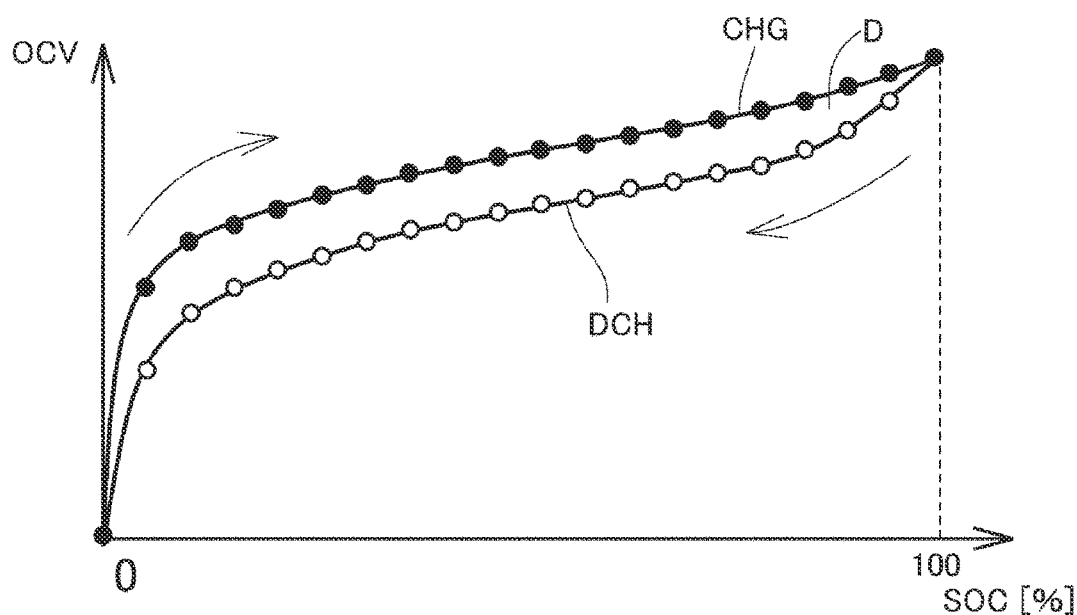
FIG. 4 is a view showing one example of hysteresis observed in electromotive voltage of a battery assembly in the embodiment.

FIG. 4 shows one example of hysteresis observed in the electromotive voltage of the battery assembly 10 according to this embodiment. In FIG. 4, the horizontal axis indicates the SOC of the battery assembly 10, and the vertical axis indicates the OCV of the battery assembly 10. This also applies to FIG. 5A through FIG. 7B that will be described later.

FIG. 4 shows a curve (labelled with "CHG") obtained through charge of the battery assembly 10, and a curve (labelled with "DCH") obtained through discharge of the battery assembly 10. In the following description, the OCV on the curve CHG will be called "charge OCV", and the OCV on the curve DCH will be called "discharge OCV". A deviation or gap (for example, about 150 mV in the case of a silicon-based compound) between the charge OCV and the discharge OCV at the same SOC represents electromotive voltage hysteresis.

The charge OCV indicates the highest value that can be taken by the OCV at each SOC, and the discharge OCV indicates the lowest value that can be taken by the OCV at each SOC. Thus, in the SOC-OCV characteristic diagram, the state (namely, a combination of the SOC and the OCV) of the battery assembly 10 is supposed to be plotted on the charge OCV, or on the discharge OCV, or within an intermediate region D surrounded by the charge OCV and the discharge OCV. The charge OCV and discharge OCV (the outer periphery of the intermediate region D) corresponds to the outer periphery of the surface stress 6 (the outer periphery of the parallelogram) schematically shown in FIG. 3.

The charge OCV can be obtained as follows. Initially, a unit cell in a fully discharged state is prepared, and the unit cell is charged with the amount of electricity corresponding to 5% SOC, for example. The charging is stopped after the unit cell is charged with the above amount of electricity, and the unit cell is left as it stands, for a period of time (e.g., 30 min.) until polarization caused by charging is eliminated. After a lapse of the standing time, the OCV of the unit cell is measured. Then, a combination (SOC, OCV) of the SOC (=5%) after charging, and the measured OCV is plotted in the graph of FIG. 4.

Subsequently, charging (charging from SOC=5% to 10%) with the amount of electricity corresponding to the next 5% of the SOC is started. When charging up to SOC 10% is completed, the OCV of the unit cell is measured in the same manner after a lapse of the standing time. Then, from the measurement result of the OCV, a combination of the SOC and the OCV is plotted again. Then, the same procedure is repeated until the unit cell reaches the fully charged state. With these measurements thus carried out, the charge OCV can be obtained.

Then, the OCV of the unit cell corresponding to the SOC at an interval of 5% is measured while discharging of the unit cell and stop of discharging are repeated, until the unit cell reaches the fully discharged state from the fully charged state. With the measurements thus carried out, the discharge OCV can be obtained. The obtained charge OCV and discharge OCV are stored in the memory 100B of the ECU 100.

Next, the ideal OCV and the reference SOC will be described. When hysteresis is observed in the electromotive voltage as described above, a reference OCV and a reference SOC are needed for estimation of the SOC. In the following description, it is assumed that estimation of the SOC is periodically repeated.

Figure 5A:
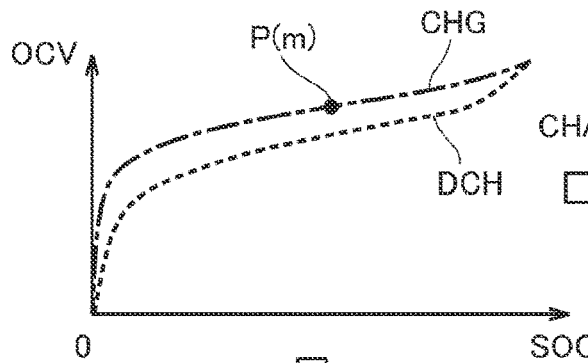
FIG. 5A is a conceptual diagram useful for describing a state of the battery assembly 10 in an SOC-OCV characteristic diagram.

FIG. 5A to FIG. 5E are conceptual diagrams useful for explaining the state of the battery assembly 10 in the SOC-OCV characteristic diagram. In these figures, the state (combination of the OCV and the SOC) of the battery assembly 10 in an m-th (where m is a natural number) computation cycle is denoted as "P(m)". FIG. 5A shows an example in which the battery assembly 10 is charged (for example, externally charged via the inlet 40), and the state P(m) of the battery assembly 10 is plotted on the charge OCV.

Figure 5B:
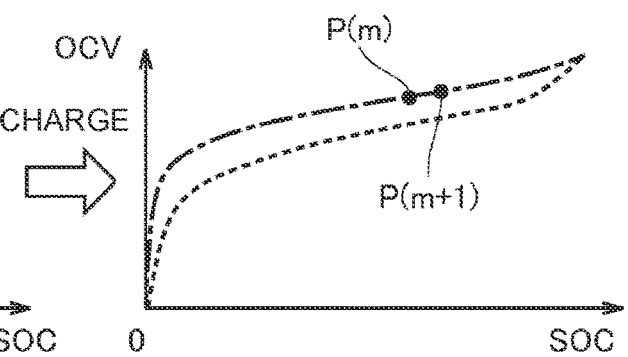
FIG. 5B is a conceptual diagram useful for describing a state of the battery assembly 10 in the SOC-OCV characteristic diagram.

When the battery assembly 10 continues to be charged from the state P(m), the state P(m+1) in the (m+1)th computation cycle is kept lying on the charge OCV as shown in FIG. 5B. Thus, when the state P of the battery assembly 10 is plotted on the charge OCV, the SOC can be estimated from the OCV, by referring to the charge OCV.

Figure 5C:
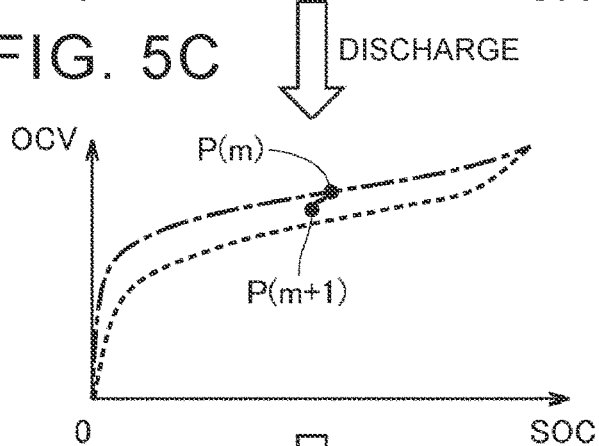
FIG. 5C is a conceptual diagram useful for describing a state of the battery assembly 10 in the SOC-OCV characteristic diagram.
Figure 5D:
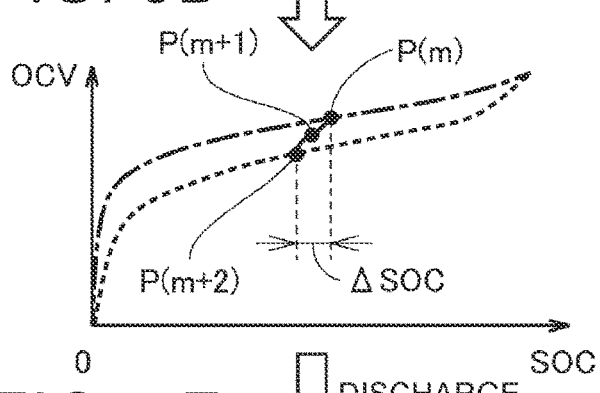
FIG. 5D is a conceptual diagram useful for describing a state of the battery assembly 10 in the SOC-OCV characteristic diagram.
Figure 5E:
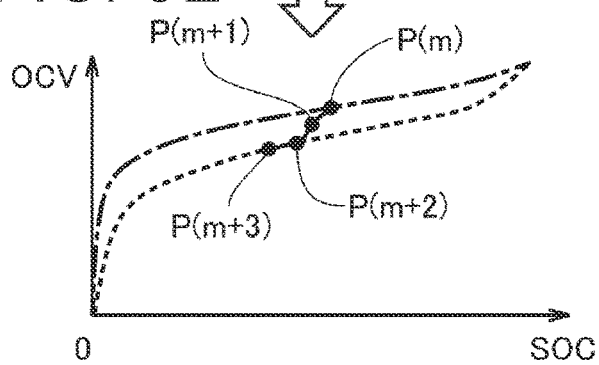
FIG. 5E is a conceptual diagram useful for describing a state of the battery assembly 10 in the SOC-OCV characteristic diagram.

On the other hand, when the battery assembly 10 is discharged from the state P(m) shown in FIG. 5A, the state P(m+1) in the (m+1)th computation cycle deviates from the charge OCV, and is plotted in the intermediate region D between the charge OCV and the discharge OCV, as shown in FIG. 5C.

If the battery assembly 10 continues to be discharged, the state P(m+2) reaches the discharge OCV, in the (m+2)th computation cycle (see FIG. 5D), for example. When the battery assembly 10 still continues to be discharged, the state P(m+3) of the battery assembly 10 is kept lying on the discharge OCV (see FIG. 5E). Thus, when the state P of the battery assembly 10 is plotted on the discharge OCV, the SOC can be estimated from the OCV, by referring to the discharge OCV.

Here, in particular, how to estimate the SOC will be a problem when the state P of the battery assembly 10 is plotted in the intermediate region D between the charge OCV and the discharge OCV. In this embodiment, the surface stress σ is calculated prior to estimation of the SOC. In calculation of the surface stress σ, an amount of change ΔOCV of the OCV from the OCV (ideal OCV) as a reference OCV, and a reference SOC are calculated, as will be described later.

In this embodiment, in order to calculate the amount of change ΔOCV of the OCV, a virtual state (or so-called ideal state) in which no stress remains in the surface of the negative-electrode active material 71 is assumed, and the OCV on a charge/discharge curve obtained in this ideal state is used as the reference OCV. In the following description, the OCV on this curve will also be referred to as "ideal OCV".

Figure 6A:
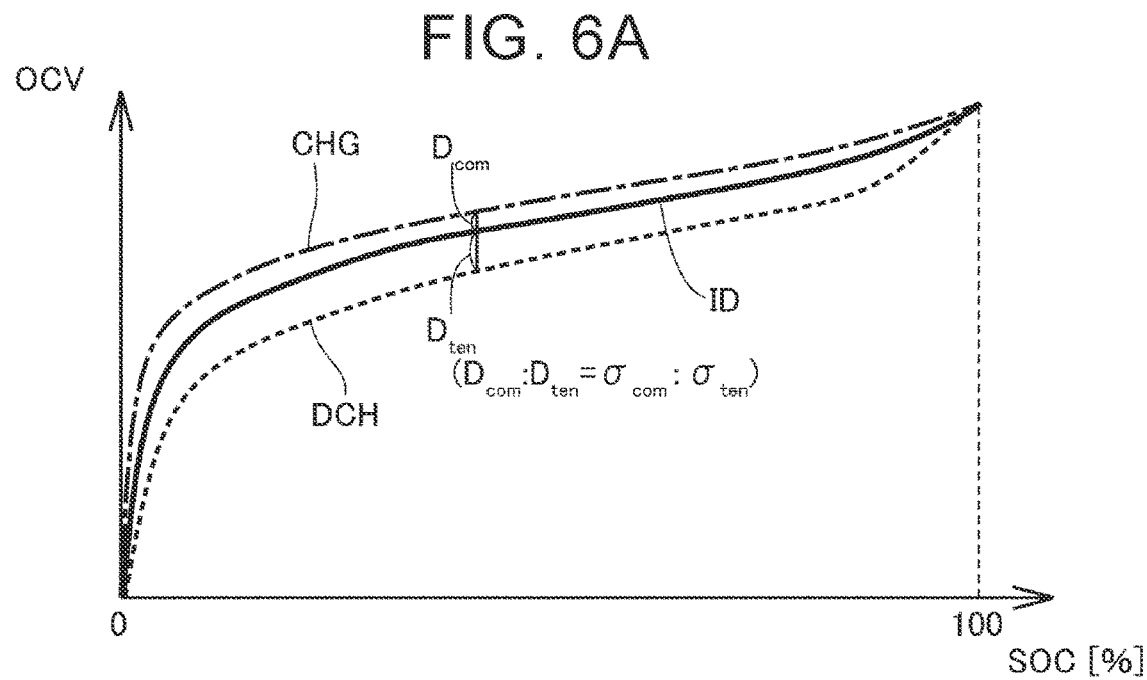
FIG. 6A is a view useful for describing an ideal OCV.
Figure 6B:
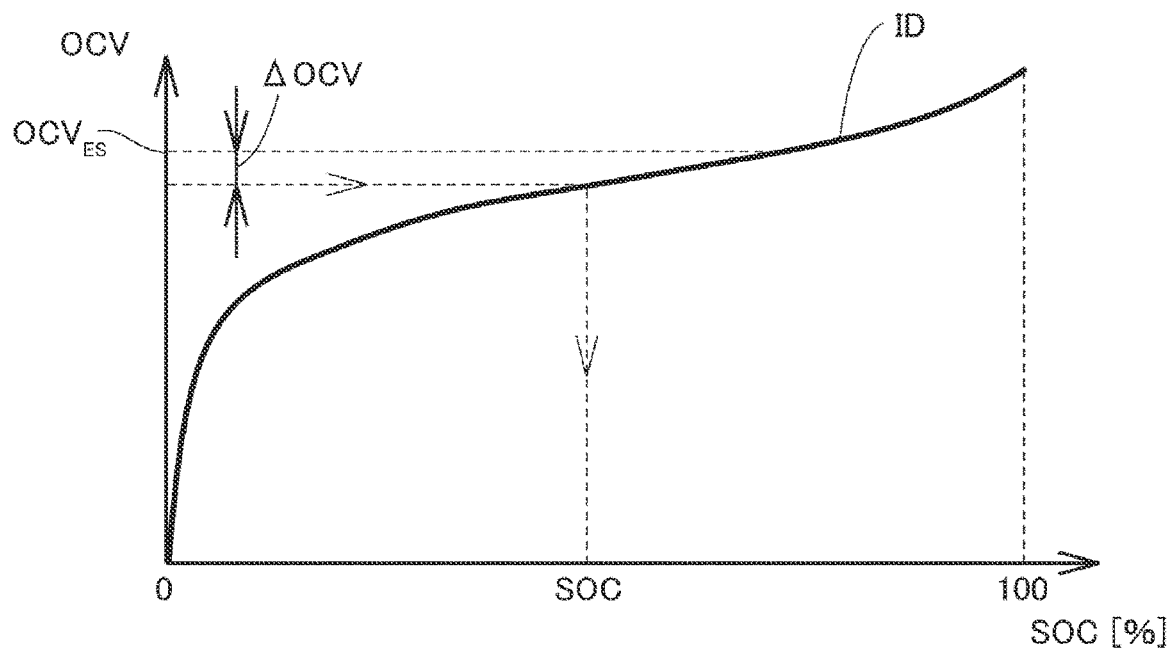
FIG. 6B is a view useful for describing the ideal OCV.

Referring to FIG. 6A and FIG. 6B, the ideal OCV will be explained. Referring to FIG. 6A, the surface stress σ on the charge OCV is almost constant at the compressive stress $\sigma_{com}$ at the time of yielding, and the surface stress σ on the discharge OCV is almost constant at the tensile stress $\sigma_{ten}$ at the time of yielding. Therefore, the surface stress σ is regarded as being substantially equal to zero, on a curve on which the ratio of the distance $D_{com}$ between the ideal OCV and the charge OCV to the distance $D_{ten}$ between the ideal OCV and the discharge OCV is equal to the ratio of the compressive stress $\sigma_{com}$ to the tensile stress $\sigma_{ten}$ ($D_{com}$:$D_{ten}$=$\sigma_{com}$:$\sigma_{ten}$). The ideal OCV can be set by calculating the curve as described above. Then, the amount of change ΔOCV of the OCV can be defined, based on the OCV on the ideal OCV curve.

On the other hand, the OCV of the battery assembly 10 can be estimated, based on measurement values obtained by respective sensors (the voltage sensor 21, current sensor 22, and temperature sensor 23) in the monitoring unit 20. The OCV thus estimated is called "estimated OCV", and is also denoted as "$OCV_{ES}$". The estimated OCV deviates from the ideal OCV under an influence of the surface stress σ. Where the ideal OCV is defined as described above, the amount of change ΔOCV of the OCV indicates a deviation (amount of deviation) of the OCV due to the surface stress σ.

Therefore, the OCV from which the influence of the surface stress σ is removed is obtained by correcting the estimated OCV, using the amount of change ΔOCV of the OCV, so that the SOC can be estimated from the OCV. More specifically, as shown in FIG. 6B, the SOC corresponding to ($OCV_{ES}$+ΔOCV) as a result of adding the amount of change ΔOCV of the OCV to the estimated OCV is obtained on the ideal OCV curve, and the thus obtained SOC is set as the SOC of the battery assembly 10, so that the SOC that takes account of the influence of the surface stress σ can be obtained. It is, however, to be understood that the manner of defining the amount of change ΔOCV of the OCV as described above is merely one example, and the method of defining the amount of change ΔOCV of the OCV is not limited to this method.

Figure 7A:
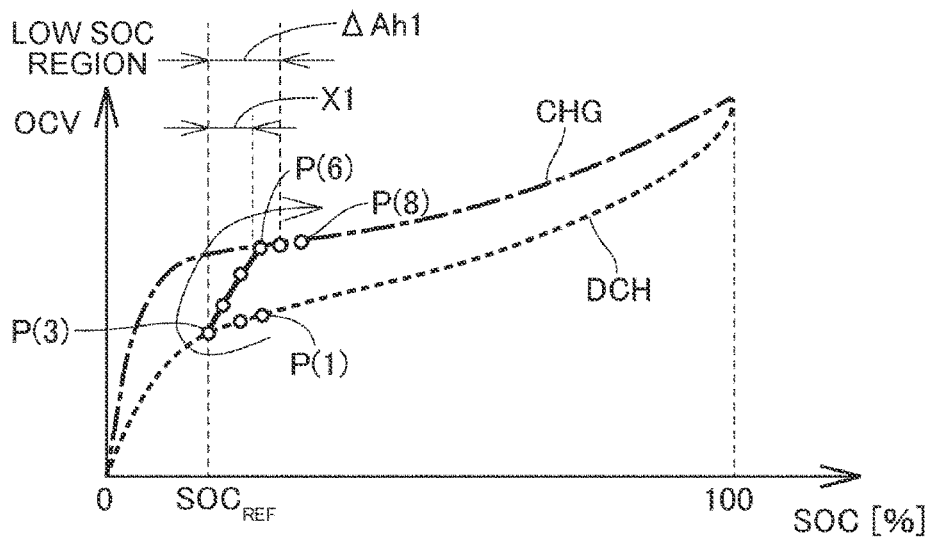
FIG. 7A is a conceptual diagram useful for describing a reference SOC.
Figure 7B:
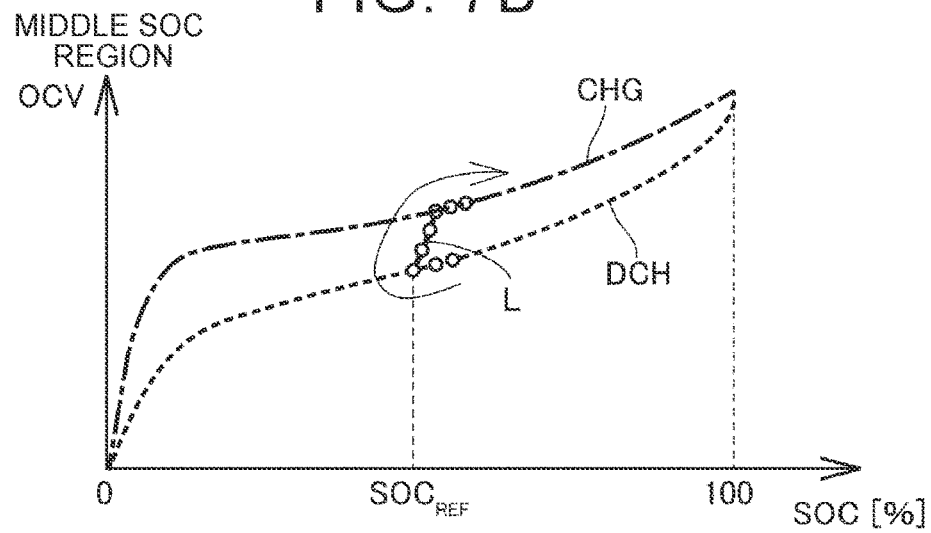
FIG. 7B is a conceptual diagram useful for describing the reference SOC.
Figure 7C:
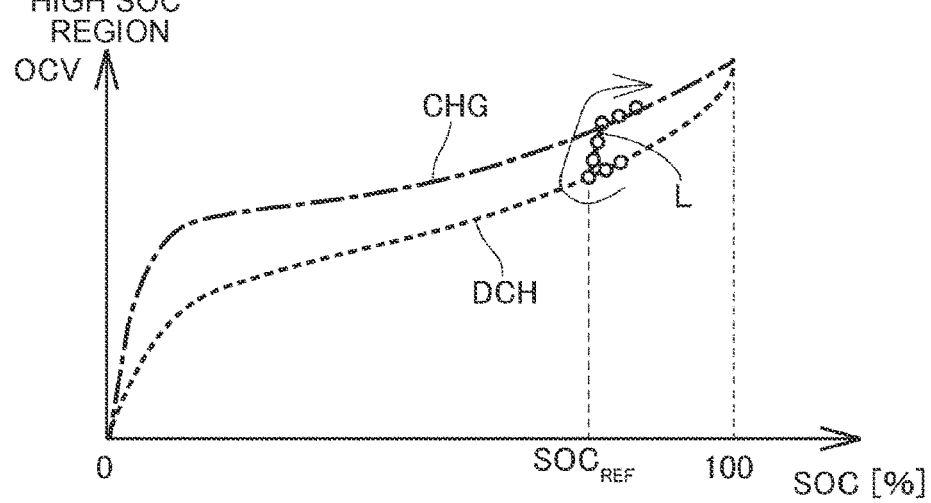
FIG. 7C is a conceptual diagram useful for describing the reference SOC.

Referring to FIG. 7A to FIG. 7C, the reference SOC ($SOC_{REF}$) will be explained. FIG. 7A to FIG. 7C show examples in which charge and discharge of the battery assembly 10 are performed in the order from P(1) to P(8) representing the respective states (see arrows in FIG. 7A to FIG. 7C). More specifically, the battery assembly 10 in the state P(1) is discharged, and the discharge is continued until the battery assembly 10 reaches the state (P3). Then, the battery assembly 10 switches from discharge to charge, in the state P(3). Thereafter, the battery assembly 10 continues to be charged until it reaches the state P(8). In FIG. 7A, only the reference symbols P(1), P(3), P(6), P(8) are assigned to the corresponding points, so as to prevent the drawings from being complex.

The inventor of this disclosure found the behavior of the battery assembly 10 by experiment as follows. Initially, the inventor measured the quantity of electricity (which will also be referred to as "charge amount ΔAh1") with which the battery assembly 10 was charged from the time of switching from discharge to charge (see the state P(3)). As a result, it was found that the state P of the battery assembly 10 may not reach the charge OCV when the charge amount ΔAh1 is smaller than a predetermined amount, whereas the state P can be regarded as reaching the charge OCV when the charge amount ΔAh1 is equal to or larger than the predetermined amount, even though the charge started from a point on the discharge OCV curve. Here, the above expression "can be regarded as reaching" may include the case where a difference between the OCV of the state P and the charge OCV became smaller than a certain amount, and the state P approximately "reached" the charge OCV, as well as the case where the state P completely reached the charge OCV. The above-indicated predetermined amount (which will be called "reference charge amount X1") can be set in the manner as described below, based on the result of experiment.

For example, when the SOC of the battery assembly 10 is within a low SOC region (a region in which the SOC is about 20%) as shown in FIG. 7A, the charge amount ΔAh1 (the above-indicated predetermined amount) required for the state P of the battery assembly 10 to reach the charge OCV is obtained. Similarly, when the SOC of the battery assembly 10 is within a middle SOC region (a region in which the SOC is about 50%) (see FIG. 7B), the charge amount ΔAh1 required for the state P to reach the charge OCV is obtained by experiment. This is similarly applied to the case where the SOC of the battery assembly 10 is within a high SOC region (a region in which the SOC is about 80%) as shown in FIG. 7C.

By measuring the charge amount ΔAh1 required for the state P to reach the charge OCV in various SOC regions by experiment, it was found that the charge amount ΔAh1 is, for example, the quantity of electricity corresponding to several % of the SOC of the battery assembly 10, and is almost constant, irrespective of the SOC region. Accordingly, the charge amount ΔAh1 thus obtained can be set as the reference charge amount X1. Thus, it is possible to use a common value as the reference charge amount X1, irrespective of the SOC.

However, the charge amount ΔAh1 differs slightly, depending on the SOC region; therefore, it is preferable to set the maximum value of the charge amounts ΔAh1 in all of the SOC regions as the reference charge amount X1. Alternatively, the relationship between the SOC at the time of switching between charge and discharge and the reference charge amount X1 may be stored in the form of a map in the memory 100B of the ECU 100.

Thus, the reference charge amount X1 is set based on the experimental result, and the quantity of electricity (charge amount ΔAh1) with which the battery assembly 10 has been charged from the time of switching from discharge to charge is compared with the reference charge amount X1. In this manner, it can be determined whether the state P of the battery assembly 10 has reached the charge OCV, or the state P has not yet reached the charge OCV.

For calculation of the charge amount ΔAh1, an integrated value of current from the time of switching from discharge to charge of the battery assembly 10 is used. The SOC (at the time of switching from discharge to charge) that provides a basis for current integration is the reference SOC ($SOC_{REF}$). Also, reference stress σ that will be described later is surface stress σ corresponding to the reference SOC (surface stress σ in the case where the SOC is equal to the reference SOC).

In the examples of FIG. 7A to 7C, it is determined whether the state P of the battery assembly 10 has reached the charge OCV, by comparing the charge amount ΔAh1 from the time of switching from discharge to charge, with the reference charge amount X1. Although detailed description will not be repeated, a reference discharge amount X2 can be set by conducting similar measurements at the time of switching from charge to discharge. Then, the quantity of electricity (discharge amount ΔAh2) discharged from the battery assembly 10 from the time of switching from charge to discharge is compared with the reference discharge amount X2. In this manner, it can be determined whether the state P of the battery assembly 10 has reached the discharge OCV, or the state P has not reached the discharge OCV.

The flowchart of FIG. 8 illustrates the SOC estimating process according to the first embodiment. FIG. 9 is useful for explaining the contents of parameters. The flowchart shown in FIG. 8 is called from a main routine (not shown) in given computation cycles, for example, and is executed by the ECU 100. In the memory 100B of the ECU 100, the reference $SOC_{REF}$ and reference stress $\sigma_{REF}$ obtained in the last computation cycle (last cycle) are stored. Each step (which will be abbreviated to "S") included in FIG. 8 and flowcharts that will be described later is basically implemented by software processing by the ECU 100, but may be implemented by a dedicated hardware (electric circuit) fabricated in the ECU 100.

Referring to FIG. 8 and FIG. 9, in S101, the ECU 100 obtains the voltage VB, current IB, and temperature TB of the battery assembly 10, from respective sensors (voltage sensor 21, current sensor 22 and temperature sensor 23) in the monitoring unit 20.

In S102, the ECU 100 estimates the OCV of the battery assembly 10 (calculates $OCV_{ES}$ as the estimated OCV). The $OCV_{ES}$ can be calculated according to Eq. (1) below. In Eq. (1), "R" denotes the internal resistance of the battery assembly 10. Also, $\Sigma\Delta V_i$ (where "i" is a natural number) denotes a correction term for correcting the OCV in view of an influence of polarization occurring in the battery assembly 10. With the correction term $\Sigma\Delta V_i$, the OCV is corrected in terms of polarization that derives from lithium diffusion in the positive-electrode active material and the negative-electrode active material and lithium salt diffusion in the electrolyte solution. When lithium diffusion in the negative-electrode active material is taken into consideration, it is desirable to consider influences of both of a difference in the lithium concentration within the negative-electrode active material and the internal stress. The correction term $\Sigma\Delta V_i$ is obtained in advance by preliminary experiment, and stored in the memory 100B. The correction term $\Sigma\Delta V_i$ assumes a positive value when the battery assembly 10 is charged.

$$OCV_{ES}=VB-IB \times R-\Sigma\Delta V_i \quad (1)$$

In S103, the ECU 100 reads the SOC(n−1) calculated in the last cycle from the memory 100B. Further, the ECU 100 reads the reference SOC ($SOC_{REF}$) and the reference stress $\sigma_{REF}$ stored in the memory 100B.

According to the results of experiments conducted by the inventor, a linear relationship as expressed by Eq. (2) below is established between a SOC difference ($SOC-SOC_{REF}$) obtained by subtracting the reference SOC ($SOC_{REF}$) from the current SOC, and the surface stress σ. This SOC difference corresponds to a difference obtained by subtracting the amount of lithium contained in the negative-electrode active material at the reference SOC (which corresponds to "reference charge carrier amount" in this disclosure) from the current amount of lithium contained in the negative-electrode active material 71, and the linear relationship provides a model of the concept that the surface stress σ is proportional to the amount of lithium incorporated or the amount of lithium removed.

$$\sigma=-\alpha(SOC-SOC_{REF})+\sigma_{REF} \quad (2)$$

In Eq. (2), α denotes a positive proportional constant (slope of a straight line) of the linear relationship between the surface stress σ and the SOC difference. The proportional constant α is a parameter determined according to mechanical characteristics of the negative-electrode active material 71 (and the peripheral member 72), and is obtained by experiment. More specifically, the proportional constant α can change according to the temperature of the negative-electrode active material 71 (≈the temperature TB of the battery assembly 10), and the lithium content in the negative-electrode active material 71 (in other words, the SOC of the battery assembly 10). Thus, the proportional constant α is obtained for each of various combinations of the temperature TB and SOC of the battery assembly 10, and prepared in the form of a map MP (not shown). However, the correlative relationship between either one of the temperature TB and the SOC, and the proportional constant α may be used.

In S104, the ECU 100 calculates the proportional constant α from the temperature TB and SOC (SOC in the last cycle) of the battery assembly 10, by referring to the map MP. As the temperature TB of the battery assembly 10, the temperature TB (a value obtained in S101) measured at the current time may be used as it is, or a time average value of temperatures obtained within a predetermined period (e.g., 30 min.) immediately before the current time may be used. Then, the ECU 100 calculates the surface stress σ according to Eq. (2) above (S105). This surface stress σ is provisionally calculated before yielding at the surface of the active material is taken into consideration, and the surface stress σ is determined (main calculation) through the processing of S106 to S113.

In S106, the ECU 100 compares the surface stress σ calculated in step S105, with the compressive stress $\sigma_{com}$. When the surface stress σ is equal to or less than the compressive stress $\sigma_{com}$ where the sign of the surface stress σ is taken into consideration, namely, when the magnitude of the surface stress σ is equal to or larger than the magnitude of the compressive stress $\sigma_{com}$ (where the absolute values of the stresses are compared) (YES in S106), the ECU 100 assumes that the negative-electrode active material 71 yields so that the surface stress σ becomes equal to the compressive stress $\sigma_{com}$, and determines that $\sigma=\sigma_{com}$ (S107). Then, the ECU 100 updates the reference stress $\sigma_{REF}$, by setting the surface stress σ ($=\sigma_{com}$) calculated in S105 of the current computation cycle (current cycle), to the reference stress $\sigma_{REF}$ (S108).

As described above, the charge OCV and the discharge OCV correspond to the outer periphery of the SOC dependence of the surface stress σ shown in FIG. 3. When the surface stress σ is equal to the compressive stress $\sigma_{com}$, the state of the battery assembly 10 is plotted on the charge OCV curve. On the other hand, when the surface stress σ is equal to the tensile stress $\sigma_{ten}$, the state of the battery assembly 10 is plotted on the discharge OCV curve.

When the surface stress σ is larger than the compressive stress $\sigma_{com}$ in S106 where the sign of the surface stress σ is taken into consideration, namely, when the magnitude of the surface stress σ is smaller than the magnitude of the compressive stress $\sigma_{com}$ (NO in S106), the ECU 100 proceeds to step S109, and compares the surface stress σ with the tensile stress $\sigma_{ten}$.

When the surface stress σ is equal to or larger than the tensile stress $\sigma_{ten}$ where the sign of the surface stress σ is taken into consideration, namely, when the magnitude of the surface stress σ is equal to or larger than that of the tensile stress $\sigma_{ten}$ (where the absolute values of the stresses are compared) (YES in S109), the ECU 100 assumes that the negative-electrode active material 71 yields so that the surface stress σ becomes equal to the tensile stress $\sigma_{ten}$, and determines that $\sigma=\sigma_{ten}$ (S110). Then, the ECU 100 updates the reference stress $\sigma_{REF}$ with the surface stress σ ($=\sigma_{ten}$) calculated in step S106 of the current cycle (S111).

While FIG. 3 schematically shows an example in which the compressive stress $\sigma_{com}$ and the tensile stress $\sigma_{ten}$ are almost constant, irrespective of the SOC, the compressive stress $\sigma_{com}$ and the tensile stress $\sigma_{ten}$ can change non-linearly with change of the SOC. Thus, values corresponding to the SOC of the last cycle, for example, may be set as the compressive stress $\sigma_{com}$ and the tensile stress $\sigma_{ten}$, in view of the non-linear change.

When the surface stress σ is smaller than the tensile stress $\sigma_{ten}$ in S109 (NO in S109), the surface stress σ lies between the compressive stress $\sigma_{com}$ and the tensile stress $\sigma_{ten}$ ($\sigma_{com}<\sigma<\sigma_{ten}$), and the negative-electrode active material 71 does not yield. Thus, the surface stress σ provisionally calculated in S105 is employed (S112). In this case, the reference stress $\sigma_{REF}$ is not updated, but the reference stress $\sigma_{REF}$ set in the last cycle (or a cycle prior to the last cycle) is maintained (S113).

Once the surface stress σ is determined through the processing of S106 to S113, the ECU 100 calculates the amount of change ΔOCV of the OCV from the surface stress σ (S114). More specifically, a linear relationship as expressed by Eq. (3) below is established between the amount of change ΔOCV of the OCV and the surface stress σ.

$$\Delta OCV = k \times \Omega \times \sigma / F \quad (3)$$

In Eq. (3), Ω (unit: m³/mol) denotes the amount of increase of the volume of the negative-electrode active material 71 when 1 mol of lithium is incorporated into the active material, and F (unit: C/mol) denotes the Faraday constant. In Eq. (3), k is a constant (including its sign) that is empirically obtained. By substituting the value of the surface stress σ, along with other constants (k, Ω, F), into the above equation (3), the amount of change ΔOCV of the OCV relative to the ideal OCV as a reference voltage can be calculated.

In S115, the ECU 100 corrects the estimated OCV ($OCV_{ES}$) calculated in step S102, with the amount of change ΔOCV of the OCV (more specifically, calculates $OCV_{ES}+\Delta OCV$), and calculates the SOC corresponding to ($OCV_{ES}+\Delta OCV$) as the OCV that has been corrected, by referring to the ideal OCV (see FIG. 6B). The SOC calculated in this manner is the SOC of the current cycle. The SOC of the current cycle is stored in the memory 100B.

Then, the ECU 100 determines whether yielding occurs to the negative-electrode active material 71 (step S116), through the processing of steps S106-S111. When the magnitude of the surface stress σ is equal to or larger than the magnitude of its yield value, and it is determined that yielding occurs to the negative-electrode active material 71 (YES in S116), in other words, when it is determined that the surface stress σ is equal to or less than the compressive stress $\sigma_{com}$ (S107), or it is determined that the surface stress σ is equal to or larger than the tensile stress $\sigma_{ten}$ (S110), the ECU 100 updates the reference SOC ($SOC_{REF}$) with the SOC calculated in S115 (S117). This reference SOC is used in S105 (see Eq. (2)) of the next computation cycle (next cycle). On the other hand, when it is determined that no yielding occurs to the negative-electrode active material 71 (NO in S116), the reference SOC is not updated, and the reference SOC set in the last cycle (or a cycle prior to the last cycle) is maintained.

As described above, in the first embodiment, the surface stress σ is calculated, using the linear relationship (see Eq. (2)) between the surface stress σ and the SOC difference ($SOC-SOC_{REF}$) (S105). Then, the surface stress σ is compared with the compressive stress $\sigma_{com}$ (S106), and the surface stress σ is compared with the tensile stress $\sigma_{ten}$ (S109). When the surface stress σ exceeds the compressive stress $\sigma_{com}$ (when $\sigma \leq \sigma_{com}$), it is assumed that the surface stress σ yields at the compressive stress $\sigma_{com}$, and the surface stress σ is determined as being equal to $\sigma_{com}$ ($\sigma=\sigma_{com}$) (S107). When the surface stress σ exceeds the tensile stress $\sigma_{ten}$ (when $\sigma \geq \sigma_{ten}$), it is assumed that yielding of the negative-electrode active material 71 occurs, and the surface stress σ is determined as being equal to $\sigma_{ten}$ ($\sigma=\sigma_{ten}$) (S110). On the other hand, when no yielding of the negative-electrode active material 71 occurs (when $\sigma_{com}<\sigma<\sigma_{ten}$), the surface stress σ calculated according to the above linear relationship is employed as it is (S112). Thus, the surface stress σ can be estimated with high accuracy, by using a model in which yielding of the negative-electrode active material 71 and the above linear relationship are taken into consideration.

Further, in the first embodiment, the amount of change ΔOCV of the OCV from the ideal OCV is calculated from the surface stress σ thus estimated with high accuracy, according to Eq. (3) (S115). Then, with reference to the ideal OCV, the SOC can be estimated with high accuracy, using the amount of change ΔOCV of the OCV. The first embodiment is particularly effective when the amount of change of volume during charge and discharge is large, and the active material (silicon-based compound) in which the influence of hysteresis appears prominently is employed as the negative electrode 117. However, the first embodiment can also be applied to the case where a general negative-electrode active material (such as graphite) is used.

Next, a second embodiment will be described. In the first embodiment, the process of estimating the SOC of the battery assembly 10 from the surface stress σ has been described. In the second embodiment, a process of determining a degree of deterioration, or the state of health (SOH) of the battery assembly 10, more specifically, a process of calculating the full charge capacity of the battery assembly 10 (a full charge capacity calculating process) will be described.

The flowchart of FIG. 10 illustrates the full charge capacity calculating process according to the second embodiment. Referring to FIG. 10, in S201, the ECU 100 starts integrating electric current, using the current sensor 22.

In S202, the ECU 100 executes the first SOC estimating process (see FIG. 8) similar to that of the first embodiment. The SOC estimated by the first SOC estimating process is denoted as "S1".

In order to estimate the full charge capacity C with high accuracy, it is desirable that the absolute value of the amount of change ΔAh in the capacity of the battery assembly 10 (=the amount of change ΔSOC of the SOC) between the first SOC estimating process and the second SOC estimating process is relatively large. Thus, when the absolute value |ΔAh|) of the amount of change in the capacity of the battery assembly 10 (or |ΔSOC|) becomes equal to or larger than a predetermined amount (YES in S203), the ECU 100 determines that a condition for executing the second SOC estimating process is satisfied, stops current integration (S204), and executes the second SOC estimating process (S205). The SOC estimated by the second SOC estimating process is denoted as "S2".

In S206, the ECU 100 calculates the full charge capacity C of the battery assembly 10, using S1, S2 as the results of estimation in the above two SOC estimating processes and the amount of change ΔAh in the capacity. More specifically, the full charge capacity C can be calculated according to Eq. (4) below.

$$C=\Delta Ah/(S1-S2)\times 100 \quad (4)$$

As described above, according to the second embodiment, the SOC is estimated using the SOC estimating process according to the first embodiment, and the full charge capacity C is calculated using the results of the estimation. Thus, since the full charge capacity C is calculated, using the SOC estimated with high accuracy in view of hysteresis caused by the surface stress σ, the full charge capacity C can also be calculated with high accuracy.

Next, a third embodiment will be described. For example, a composite material or composite body including a silicon-based compound and graphite may be considered to be employed as a negative-electrode active material. An SOC–OCV curve in the case where the composite material is employed shows a hysteresis characteristic different from that in the case where a silicon-based compound is employed alone. In the third embodiment, an SOC estimating process for exploiting the hysteresis characteristic of the composite material will be described.

Figure 11:
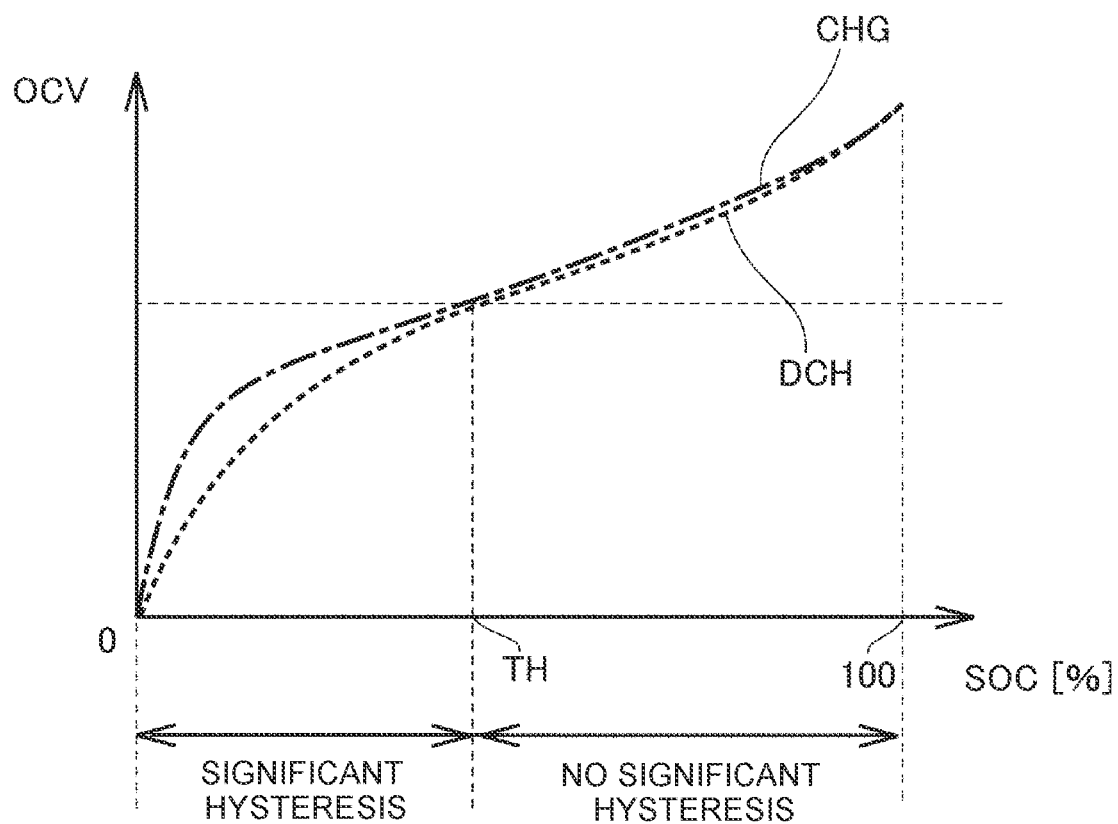
FIG. 11 is a view useful for explaining hysteresis characteristics according to a third embodiment.

Referring to FIG. 11, the hysteresis characteristic in the third embodiment will be described. As shown in FIG. 11, when the composite material including the silicon-based compound and graphite is employed, the SOC region in which significant hysteresis is observed in the OCV is limited to a low SOC region (in FIG. 11, SOC region smaller than TH). The threshold value TH may be obtained by preliminary experiment.

Figure 12:
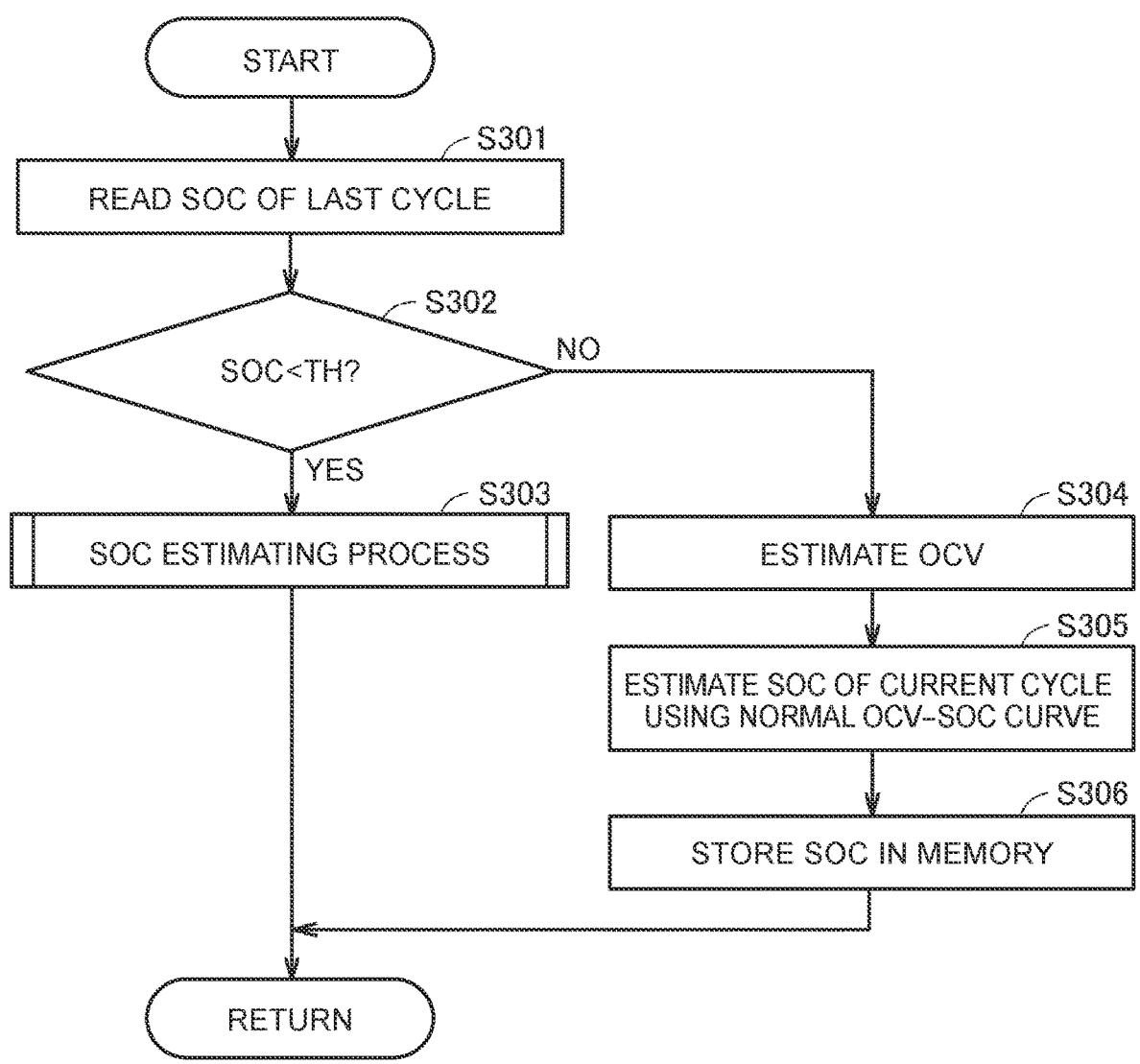
FIG. 12 is a flowchart illustrating an SOC estimating process according to the third embodiment.

The flowchart of FIG. 12 illustrates an SOC estimating process according to the third embodiment. Referring to FIG. 12, in S301, the ECU 100 retrieves the SOC estimated in the last computation cycle (last cycle) from the memory 100B.

In S302, the ECU 100 determines whether the SOC of the last cycle is smaller than the threshold value TH. When the SOC of the last cycle is smaller than the threshold value TH (YES in S302), the ECU 100 executes an SOC estimating process similar to that of the first embodiment (see FIG. 8) (S303).

On the other hand, when the SOC of the last cycle is equal to or larger than the threshold value TH (NO in S302), the ECU 100 estimates the SOC by a general method. More specifically, initially, the ECU 100 estimates the OCV of the battery assembly 10 (S304). Then, the ECU 100 estimates the SOC of the current cycle, from the OCV estimated in step S304, using a normal SOC–OCV curve that does not take account of hysteresis caused by the surface stress σ (S305). The estimated SOC is stored in the memory 100B (S306), and is used in S301 of the next cycle.

According to the third embodiment, when the composite material is employed as the negative-electrode active material, the SOC is estimated in view of hysteresis caused by the surface stress σ, in the low SOC region (second SOC region) in which significant hysteresis is observed in the OCV. On the other hand, the SOC is estimated by the general method in a high SOC region (first SOC region) in which significant hysteresis is not observed. The SOC estimation in view of hysteresis caused by the surface stress σ requires a larger calculation resource than the SOC estimation according to the general method. Therefore, the computation resource of the ECU 100 can be saved by using the general method in the high SOC region.

While the composite material including the silicon-based material and graphite is employed as the negative-electrode active material in the embodiment of FIG. 11 and FIG. 12, the negative-electrode active material may include another material or materials, provided that the material exhibits significant hysteresis only in a part of the SOC region. As an example of such material, a composite material including a silicon-based material and lithium titanate may be listed. This composite material is known as giving rise to significant hysteresis in a high SOC region. In this case, in the control routine shown in FIG. 12, it is only required to reverse the inequality sign in S302.

In the first to third embodiments, the silicon-based compound is used, as the negative-electrode active material having a large amount of volume change during charge or discharge. However, the negative-electrode active material having a large amount of volume change during charge or discharge is not limited to the silicon-based compound. In this specification, the "negative-electrode active material having a large amount of volume change" means a material having a larger amount of volume change as compared with the amount of volume change (about 10%) of graphite during charge or discharge. Examples of such a negative-electrode material of the lithium-ion secondary battery include a tin-based compound (e.g., Sn or SnO), germanium (Ge)-based compound, and a lead (Pb)-based compound. The electrolyte of the lithium-ion secondary battery is not limited to that of a liquid type, but may be of a polymer type, or all solid type. Also, when the amount of volume change of a positive-electrode active material is large, hysteresis derived from the positive electrode may be taken into consideration.

Further, the secondary battery to which the SOC estimating processes described above in the first and third embodiments and the full charge capacity calculating process described above in the second embodiment can be applied is not limited to the lithium-ion secondary battery, but may be another type of secondary battery (e.g., a nickel hydride battery). Also, the surface stress σ can also be produced on the positive electrode side of the secondary battery. Thus, the above-described SOC estimation processes and full charge capacity calculating process may be used, so as to take account of the surface stress σ on the positive electrode side of the secondary battery.

The embodiments disclosed herein should be considered as being not restrictive or limiting but illustrative in all points. The scope of this disclosure is not indicated in the description of the embodiments, but indicated in the appended claims, and is intended to include all changes within the range of the appended claims and their equivalents.

What is claimed is:

1. A secondary battery system comprising:
   a secondary battery having an electrode containing an active material into and from which a charge carrier is reversibly incorporated and removed; and
   a control unit configured to estimate a stress generated in the active material as the charge carrier is incorporated into or removed from the active material,
   wherein the control unit is configured to calculate an estimated value of the stress from a difference obtained by subtracting a reference charge carrier amount from an amount of the charge carrier contained in the active material, using a first linear relationship between the difference and the stress, correct the estimated value to a yield stress of the active material when a magnitude of the estimated value is larger than a magnitude of the yield stress of the active material, and control charging and discharging of the secondary battery in accordance with an estimated State of Charge (SOC) as determined by the estimated stress.

2. The secondary battery system according to claim 1, wherein:
   the amount of the charge carrier contained in the active material is represented by an SOC of the secondary battery; and
   the reference charge carrier amount is represented by a reference SOC as the SOC obtained at a time when the secondary battery is switched between charge and discharge in a condition where the stress is the yield stress.

3. The secondary battery system according to claim 2, wherein the first linear relationship is expressed by an equation (1):

$$\sigma = -\alpha(SOC - SOC_{REF}) + \sigma_{REF} \quad (1),$$

in the equation (1), $\sigma$ denotes the stress, $SOC_{REF}$ denotes the reference SOC, $\sigma_{REF}$ denotes a stress in a case where the SOC of the secondary battery is the reference SOC, and $\alpha$ denotes a proportional constant indicating the first linear relationship.

4. The secondary battery system according to claim 3, wherein the control unit is configured to calculate the proportional constant from at least one of a temperature and the SOC of the secondary battery, using a correlative relationship between at least one of the temperature and the SOC of the secondary battery, and the proportional constant.

5. The secondary battery system according to claim 1, wherein:
   the control unit is configured to execute an SOC estimating process of estimating the SOC of the secondary battery, and calculates an amount of change of an OCV from the stress, using a second linear relationship between the amount of change of the OCV caused by the stress, relative to the OCV in a case where the stress is a reference stress, and the stress, in the SOC estimating process; and
   the control unit is configured to estimate the SOC of the secondary battery from the amount of change of the OCV, by referring to a first correspondence relationship between the OCV and the SOC of the secondary battery when the stress is the reference stress.

6. The secondary battery system according to claim 5, wherein the control unit is configured to estimate a first SOC by executing the SOC estimating process, estimate a second SOC by executing the SOC estimating process again when an amount of change in a capacity of the secondary battery from a time of estimation of the first SOC exceeds a predetermined amount, and calculate a full charge capacity of the secondary battery, based on an SOC difference between the first SOC and the second SOC, and the amount of change in the capacity of the secondary battery between the time of estimation of the first SOC, and a time of estimation of the second SOC.

7. The secondary battery system according to claim 5, wherein:
   the active material comprises a first active material and a second active material;
   an amount of change in a volume of the second active material during charge or discharge of the secondary battery is larger than an amount of change in a volume of the first active material during charge or discharge of the secondary battery;
   a relationship between the OCV and the SOC of the secondary battery includes a first SOC region, and a second SOC region having larger hysteresis of the OCV of the secondary battery during charge or discharge of the secondary battery, than that of the first SOC region; and
   the control unit is configured to repeatedly estimate the SOC of the secondary battery, and execute the SOC estimating process when the SOC of the secondary battery estimated in a last cycle is within the second SOC region, the control unit being configured to estimate the SOC of the secondary battery according to a second correspondence relationship between the OCV and the SOC of the secondary battery other than the first correspondence relationship, when the SOC of the secondary battery estimated in the last cycle is within the first SOC region.

8. A method of estimating a stress generated in an active material of a secondary battery, as a charge carrier is incorporated into and is removed from the active material, comprising:
   calculating an estimated value of the stress from a difference obtained by subtracting a reference charge carrier amount from an amount of the charge carrier contained in the active material, using a linear relationship between the difference and the stress;
   correcting the estimated value to a yield stress of the active material when a magnitude of the estimated value is larger than a magnitude of the yield stress of the active material; and
   controlling charging and discharging of the secondary battery in accordance with an estimated State of Charge (SOC) as determined by the estimated stress.

9. A secondary battery system comprising:
   a secondary battery having an electrode containing an active material into and from which a charge carrier is reversibly incorporated and removed; and
   a control unit configured to estimate a stress generated in the active material as the charge carrier is incorporated into or removed from the active material,
   wherein the control unit is configured to calculate an estimated value of the stress from a difference obtained by subtracting a reference charge carrier amount from an amount of the charge carrier contained in the active material, using a first linear relationship between the difference and the stress, correct the estimated value to a yield stress of the active material when the estimated value is larger than tensile stress of the active material at a time of yielding or is smaller than compressive stress of the active material at the time of yielding, and control charging and discharging of the secondary battery in accordance with an estimated State of Charge (SOC) as determined by the estimated stress.

* * * * *